United States Patent
Lin et al.

(10) Patent No.: US 8,193,095 B2
(45) Date of Patent: Jun. 5, 2012

(54) METHOD FOR FORMING SILICON TRENCH

(75) Inventors: Ching-Fuh Lin, Taipei (TW); Shih-Che Hung, Taipei (TW); Shu-Jia Syu, Taipei (TW)

(73) Assignee: National Taiwan University, Taipei (TW)

( * ) Notice: Subject to any disclaimer, the term of this patent is extended or adjusted under 35 U.S.C. 154(b) by 1 day.

(21) Appl. No.: 13/026,164

(22) Filed: Feb. 11, 2011

(65) Prior Publication Data

US 2011/0294255 A1 Dec. 1, 2011

Related U.S. Application Data

(63) Continuation-in-part of application No. 12/790,331, filed on May 28, 2010.

(30) Foreign Application Priority Data

Oct. 13, 2010 (TW) .............................. 99134859 A

(51) Int. Cl.
*H01L 21/311* (2006.01)
(52) U.S. Cl. .......... 438/700; 438/98; 438/534; 438/704; 438/705; 438/706; 438/707; 438/720; 438/735; 438/738; 257/E31.124; 977/856; 977/888
(58) Field of Classification Search .................. 977/856, 977/888
See application file for complete search history.

(56) References Cited

U.S. PATENT DOCUMENTS

| 7,135,414 B2 | 11/2006 | Matsumura et al. |
| 2005/0101153 A1 | 5/2005 | Matsumura et al. |
| 2006/0006463 A1 | 1/2006 | Islam et al. |
| 2010/0248449 A1* | 9/2010 | Hildreth et al. ............... 438/460 |

FOREIGN PATENT DOCUMENTS

| TW | 553892 | 9/2003 |
| TW | I295274 | 4/2008 |
| TW | 200908070 | 2/2009 |

OTHER PUBLICATIONS

Huang et al. ("Extended Array of Vertically Aligned Sub-10 nm Diameter [100] Si Nanowires by Metal-Assisted Chemical Etching", Nano Letters, vol. 8, No. 9, pp. 3046-3051, 2008).*

* cited by examiner

*Primary Examiner* — Alexander Ghyka
*Assistant Examiner* — Yasser Abdelaziez
(74) *Attorney, Agent, or Firm* — Stout, Uxa, Buyan & Mullins, LLP

(57) ABSTRACT

A method for forming a silicon trench, comprises the steps of: defining an etching area at a silicon substrate; forming metal catalysts at the surface of the etching area; immersing the silicon substrate in a first etching solution thereby forming anisotropic silicon nanostructures in the etching area; immersing the silicon substrate in a second etching solution thereby resulting in the silicon nanostructures being side-etched and detached from the silicon substrate, thus forming the silicon trench.

19 Claims, 6 Drawing Sheets

METHOD FOR FORMING SILICON TRENCH

CROSS-REFERENCE TO RELATED APPLICATIONS

This application is a continuation-in-part of co-pending U.S. application Ser. No. 12/790,331, filed May 28, 2010 and entitled SILICON NANOSTRUCTURES AND METHOD FOR PRODUCING THE SAME AND APPLICATION THEREOF, and claims the priority of Taiwan Patent Application No. 099134859, filed on Oct. 13, 2010, the entire contents both of which are incorporated herein by reference.

BACKGROUND OF THE INVENTION

1. Field of the Invention

The present invention relates to methods for forming semiconductor trenches, particularly silicon trenches.

2. Description of Related Art

Highly anisotropic etching structures in silicon have many applications. For example, anisotropic trenches are required during the fabrication of semiconductor devices, such as optical biosensors, optical switches, and metal-oxide-semiconductor field effect transistor devices.

The dimensions of these trenches typically range from 1-4 μm in width and 0.5-5 μm in depth. During the fabrication of microelectromechanical systems, however, deeper anisotropic trenches are usually needed. For example, the patterning of silicon is an essential step and it may demand deep silicon trenches with depths between 10 and 100 μm. Furthermore, recently ultrathin silicon solar microcells have received increasing attention due to the reduction of material consumption. During its fabrication, pre-etching with depths of about 10 μm in the vertical direction is required for wafer slicing.

Numerous methods, including reactive ion etching (RIE), potassium hydroxide (KOH) wet chemical etching, and laser-assisted direct imprint (LADI), have been developed to fabricate silicon trenches. However, these methods have several drawbacks. RIE is a typical method for creating highly anisotropic structures in conventional semiconductor fabrication, but it utilizes expensive instruments and is rarely performed on an ultra-large scale. Moreover, an additional hard etching mask is needed for deep RIE. KOH wet chemical etching is a low cost and large-area fabrication method, but the etching direction is restricted due to the crystal orientation. LADI is a rapid etching-free technique for patterning nanostructures in silicon; however, the produced line widths and depths by LADI are limited to sub-micrometers.

Accordingly, it would be advantageous to develop a low cost and large-area method for fabricating highly anisotropic Si trenches with dimensions from nanometers to micrometers.

SUMMARY OF THE INVENTION

An object of the present invention is to provide a low cost method for fabricating highly anisotropic silicon trenches with depth reaching to micrometers scale, and the silicon trenches can be produced in a large-area manner.

Accordingly, an embodiment of this invention provides a method for forming a silicon trench, comprising the steps of: providing a silicon substrate; forming a patterned etching-barrier layer on the silicon substrate, thereby defining an etching area; forming a plurality of metal catalysts on the etching area; immersing the silicon substrate in a first etching solution to etch silicon under the metal catalysts in an anisotropic direction, the remained silicon forming a plurality of silicon nanostructures; immersing the silicon substrate in a second etching solution, resulting a side etching between the silicon nanostructures and the silicon substrate, thereby substantially detaching the silicon nanostructures from the silicon substrate; and removing the silicon nanostructures, the metal catalysts, and the etching-barrier layer, thereby forming the silicon trench.

DESCRIPTION OF THE PREFERRED EMBODIMENT

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known components and process operations are not described in detail in order not to unnecessarily obscure the present invention. While drawings are illustrated in detail, it is appreciated that the quantity of the disclosed components may be greater or less than that disclosed, except where expressly restricting the amount of the components.

Figure 1A:
FIG. 1A to FIG. 1F show a method for forming a semiconductor trench according to an embodiment of the present invention.

FIG. 1A to FIG. 1F show a method for forming a semiconductor trench according to one embodiment of the present invention. Referring to FIG. 1A, a silicon substrate 10 is provided. The silicon substrate 10 may be n-type or p-type of single-crystalline, poly-crystalline, or amorphous silicon substrate, and it may be cleaned by one or more solvents or water before other steps are performed.

Figure 1B:
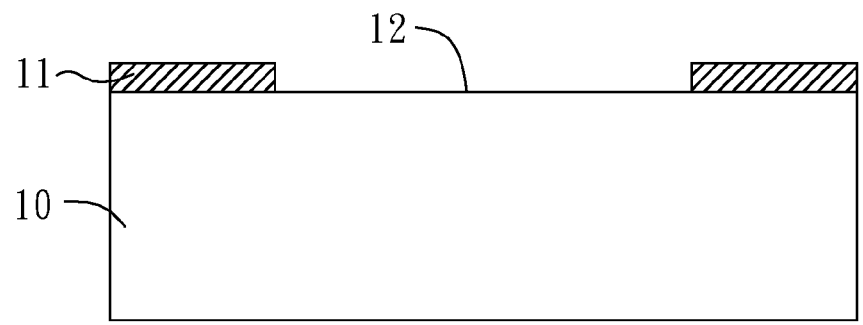

Referring to FIG. 1B, a photoresist 11 is formed on the silicon substrate 10 and an etching area 12 is defined by standard photolithography. The photoresist 11 may be replaced by silicon nitrides ($Si_xN_y$) or other dielectric materials, which are used as an etching-barrier layer 11 for blocking the metal catalyst (mentioned below). The defined etching area 12 may be any regular or irregular shape.

Figure 1C:
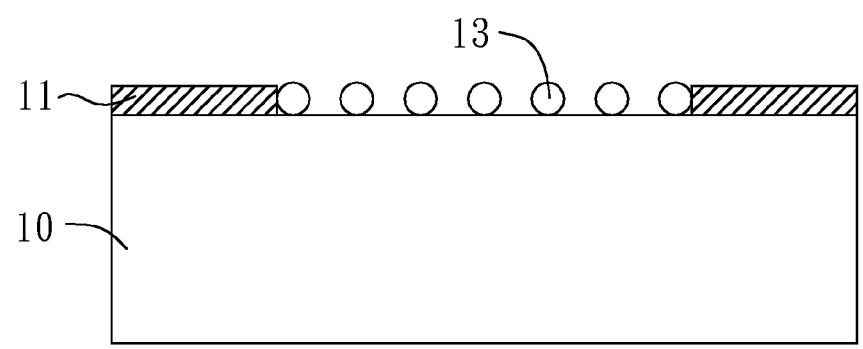

Referring to FIG. 1C, a plurality of metal catalysts 13 are deposited in the etching area 12 by electroless metal deposition (EMD), thermal evaporation, or other deposition methods known in the art. The metal catalysts 13 may comprise gold (Au), silver (Ag), copper (Cu), platinum (Pt), iron (Fe), manganese (Mn), cobalt (Co), or other metal nanostructures capable of being a mediator of the redox mechanism (described below), and the morphology of the metal catalysts 13 may comprise dendritic, granular, island-shaped, meshes-shaped, or other similar structures.

Figure 1D:
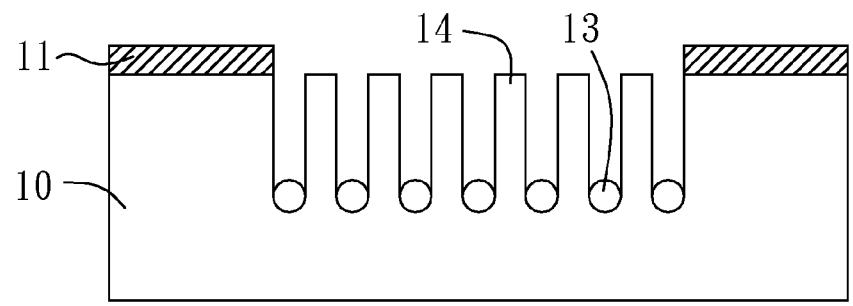

Referring to FIG. 1D, then, the silicon substrate 10 is immersed in a first etching solution, which is an aqueous solution containing metal ions and fluoride, or an aqueous solution containing hydrogen peroxide ($H_2O_2$) and fluoride. Examples of the first etching solution may comprise $HF/KAuCl_4$, $HF/AgNO_3$, $HF/K_2PtCl_6$, $HF/Cu(NO_3)_2$, $HF/(Fe(NO_3)_3$, $HF/(Mn(NO_3)_3$, $HF/Co(NO_3)_3$, $HF/H_2O_2$, or other aqueous solutions that can oxidize silicon and etch silicon oxide.

The metal ions of the first etching solution will be selectively deposited on the metal catalysts 13 or bare silicon surface. Subsequently, the rest of the metal ions of the first etching solution prefer to accumulate on the metal catalysts 13 resulting in a redox reaction, and the electrons are transferred from the metal catalysts 13 to the silicon surface. If $HF/H_2O_2$ aqueous solution is used as the first etching solution, $H_2O_2$ will be reduced to water, and electrons are transferred to the silicon surface via the metal catalysts 13. After receives the electrons, the silicon surface is oxidized to silicon oxide, such as silicon dioxide, and HF will etch the silicon dioxide, resulting in an anisotropic etching and thus forming silicon nanostructures 14.

Figure 1E:
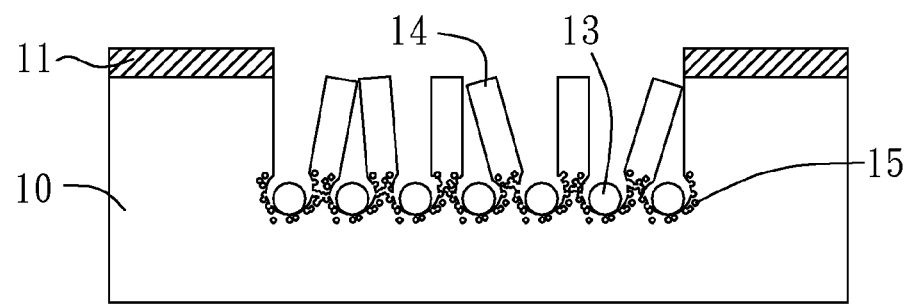

Referring to FIG. 1E, then, after the anisotropic etching reaches the desired depth, e.g., a micrometer scale depth, the substrate 10 is removed from the first etching solution and immersed in a second etching solution, which is an aqueous solution comprising fluoride and hydrogen peroxide ($H_2O_2$). By controlling the ratio of hydrogen peroxide to fluoride, the etching direction is controlled to be isotropic, resulting in porous structures 15 around the metal catalysts 13. As the etching time is increased, porous structure 15 causes side-etching at the root portion of the nanostructures 14, and thus detach or substantially detach the nanostructures 14 from the silicon substrate 10. Notice that the etching step, including etching at the first and second etching solution, can be performed at a temperature between about 0° C. to about 100° C. or more. The etching at room temperature can save energy cost; the etching at elevated temperature can promote etching rate.

Figure 1F:
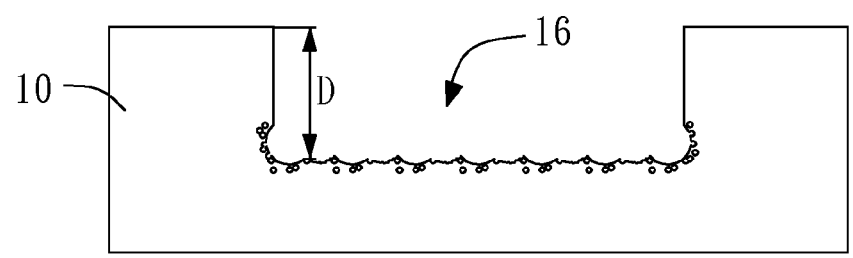

Referring to FIG. 1F, then, the silicon nanostructure 14, the metal catalysts 13, and the photoresist/etching-barrier layer 11 are sequentially removed, and thus a high degree anisotropic silicon trench 16 with a micrometer scale depth D is prepared. The sidewall and the bottom of the silicon trench 16 may be rough. Various methods, including dry oxidation, wet chemical oxidation, hydrogen annealing, and excimer laser reformation may be used to effectively reduce the roughness.

Modifications may be made to the embodiment shown in FIG. 1A to FIG. 1F. For example, instead of silicon substrate, other semiconductor substrates, such as germanium, III-V compound semiconductor, and II-VI compound semiconductor substrates, can be used to produce semiconductor trenches by using the same mechanism shown in the above embodiment. In addition, method for forming the etching area 12 may comprise electron beam lithography, nanosphere lithography, or imprint, except the photolithography. In addition, the electroless metal deposition (EMD) may comprise to immerse the silicon substrate 10 in a fluoride solution comprising metal ions, which will be reduced and deposited in the etching area 12 and thus formed as the metal catalysts 13. In addition, before forming the metal catalysts 13, an oxide layer (not shown) may be formed on the etching area 12, and then the silicon substrate 10 is immersed in the above-mentioned fluoride solution, which will etch the oxide layer and the metal ions will be reduced to form the metal catalysts 13 on the etching area 12. The oxide layer is helpful to increase the density and helpful to control the morphology of the as-prepared silicon nanostructures 14.

Some steps of the above-mentioned embodiment may use the same method described in U.S. patent application Ser. No. 12/713,094, entitled "Silicon substrate having nanostructures and method for producing the same and application thereof" and Taiwan Patent Application No. 099105914. The entire contents of the foregoing applications are incorporated herein by reference.

Example

This example employs silver as the center of the redox reaction, illustrating how silicon trenches are formed. First, a p-type Si wafer with a resistance of 1-10 Ωcm is provided and cleaned. Then, the Si wafer is spin coated with a photoresist (positive photoresist S1813) and the photoresist is patterned to define etching areas by using a typical photolithography process. Then, the Ag catalysts were subsequently deposited on the etching areas through EMD method. For example, the Si wafer is immersed in an aqueous $HF/AgNO_3$ solution including 0.02 mol/L $AgNO_3$ and 10 vol. % HF in deionized water about 20 sec, so as to deposit Ag catalysts on the etching areas.

Then, the silicon wafer is immersed in the above $HF/AgNO_3$ solution again for 10 to 30 min. Alternatively, the silicon wafer is immersed in an aqueous $HF/H_2O_2$ solution including 0.6 vol. % $H_2O_2$ and 10 vol. % HF in deionized water for about 10 to 30 min. The Ag ions of the solution will be selectively deposited on the Ag catalysts 13 or bare silicon surface. Subsequently, the rest of the Ag ions accumulate on the Ag catalysts resulting in a redox reaction, and the electrons are transferred from the Ag catalysts to the silicon surface. If $HF/H_2O_2$ aqueous solution is used as the first etching solution, $H_2O_2$ will be reduced to water, and electrons are transferred to the silicon surface via the Ag catalysts. After receives the electrons, the silicon surface is oxidized to silicon dioxide, and HF will etch the silicon dioxide, resulting in an anisotropic etching and thus forming silicon nanostructures.

Figure 2:
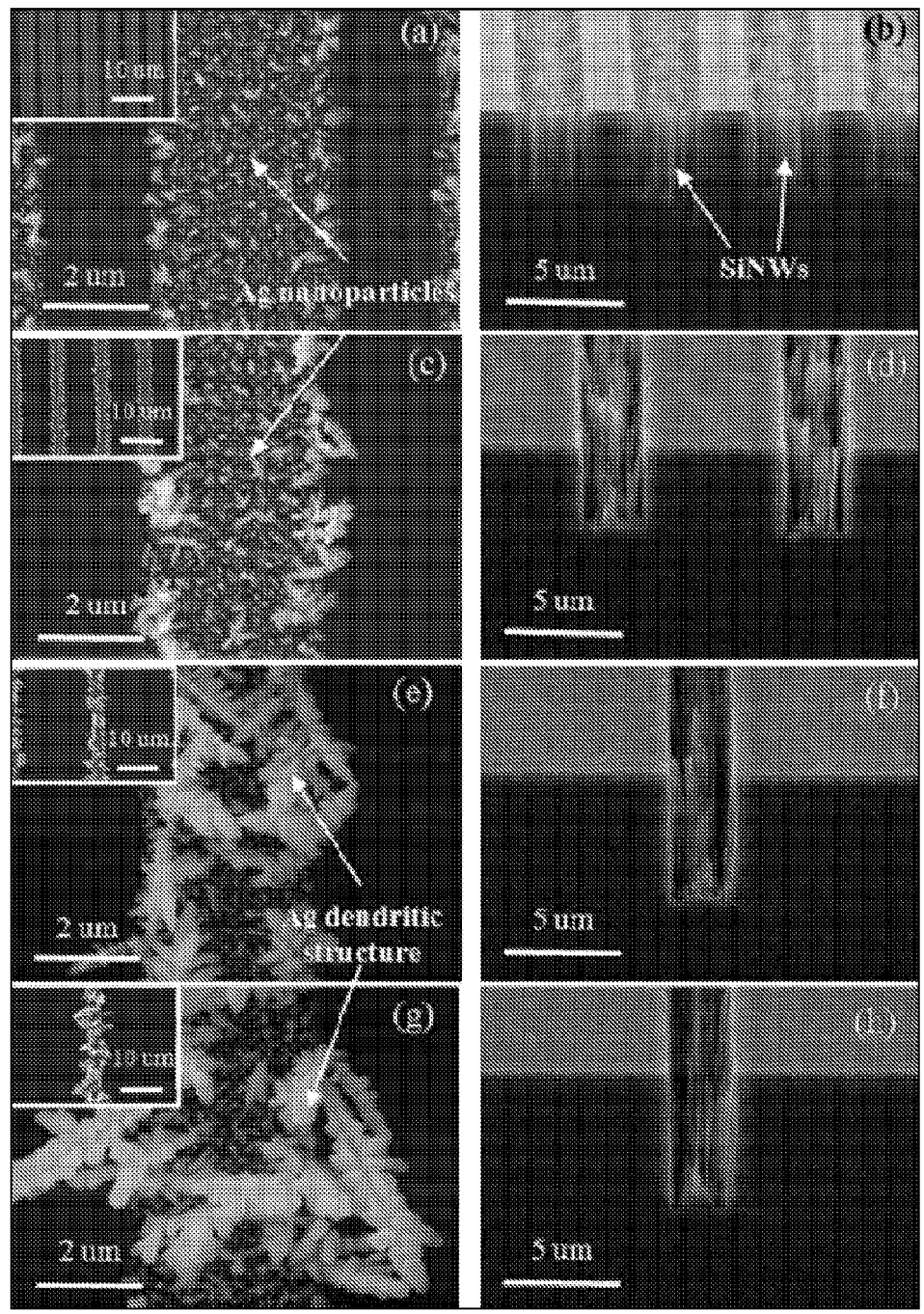
FIG. 2 shows scanning electron microscope (SEM) images of nanoparticle-shaped Ag catalysts deposited in different periods of etching area, according to an embodiment of this invention.
Figure 3:
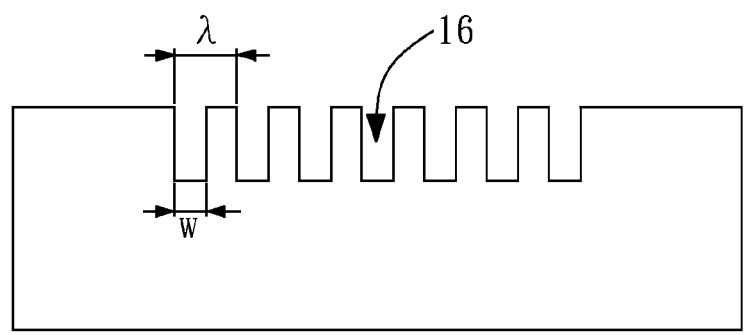
FIG. 3 shows the definition of a period of the produced semiconductor trenches, according to an embodiment of the present invention.

FIG. 2 shows scanning electron microscope (SEM) images of nanoparticle-shaped Ag catalysts deposited in different periods (λ) of etching area, according to examples of this invention. Referring to FIG. 3, a period λ, is defined as the width of a silicon trench 16 plus the spacing between two silicon trenches 16. FIG. 2(a)(c)(e)(g) respectively show Ag catalysts being deposited in period of 5 μm, 10 μm, 20 μm, and 40 μm. The inserts in FIG. 2 (a)(c)(e)(g) respectively show the corresponding SEM images in the large area. FIG. 2(b)(d)(f)(h) respectively show the corresponding SEM images of FIG. 2(a)(c)(e)(g), after it is immersed in etching solution ($HF/AgNO_3$) for 10 min and forms silicon nanowires. The etching depths of the trenches shown in FIG. 2(b)(d)(f)(h) are estimated to be 2.8, 3.7, 5.4, and 5.6 μm.

As shown in FIG. 2, because the silicon nanostructures formed in the etching areas are highly anisotropic, the etching depth can easily achieve to the micrometer scale. Then, after the desired etching depth is achieved, the silicon substrate is immersed in a hydrogen fluoride and hydrogen peroxide (HF/

$H_2O_2$) solution including 2.4 vol. % $H_2O_2$ and 6.6 vol. % HF in deionized water. Porous structures will be formed in the vicinity of Ag catalysts, resulting in side-etching and thus detaching the silicon nanostructures from the silicon substrate. Finally, after removing the silicon nanostructures (nanowires in this example), Ag catalysts, and the possible remained photoresist, highly anisotropic silicon trenches with micrometer scale are produced.

Figure 4:
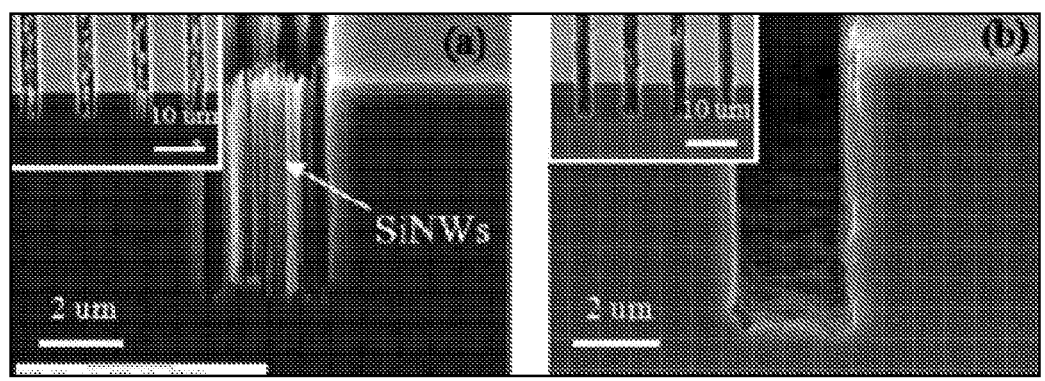
FIG. 4 shows scanning electron microscope (SEM) images of silicon trenches produced by an embodiment of the present invention.

FIG. 4 shows SEM images of the fabricated Si trenches in which portion (a) is an image of silicon nanowires (SiNWs) selectively etched by aqueous HF/AgNO3 solution, portion (b) is an image after the SiNWs are subsequently removed by aqueous $HF/H_2O_2$ solution, and the insert in portion (a) and (b) shows corresponding images in large area. The silicon nanowires were formed in the specific etching area. Deep and highly anisotropic trenches were achieved due to the self-assembled etching. The SiNWs were efficiently removed by the aqueous $HF/H_2O_2$ solution. The depth of the Si trenches was slightly larger after removing the SiNWs.

Figure 5:
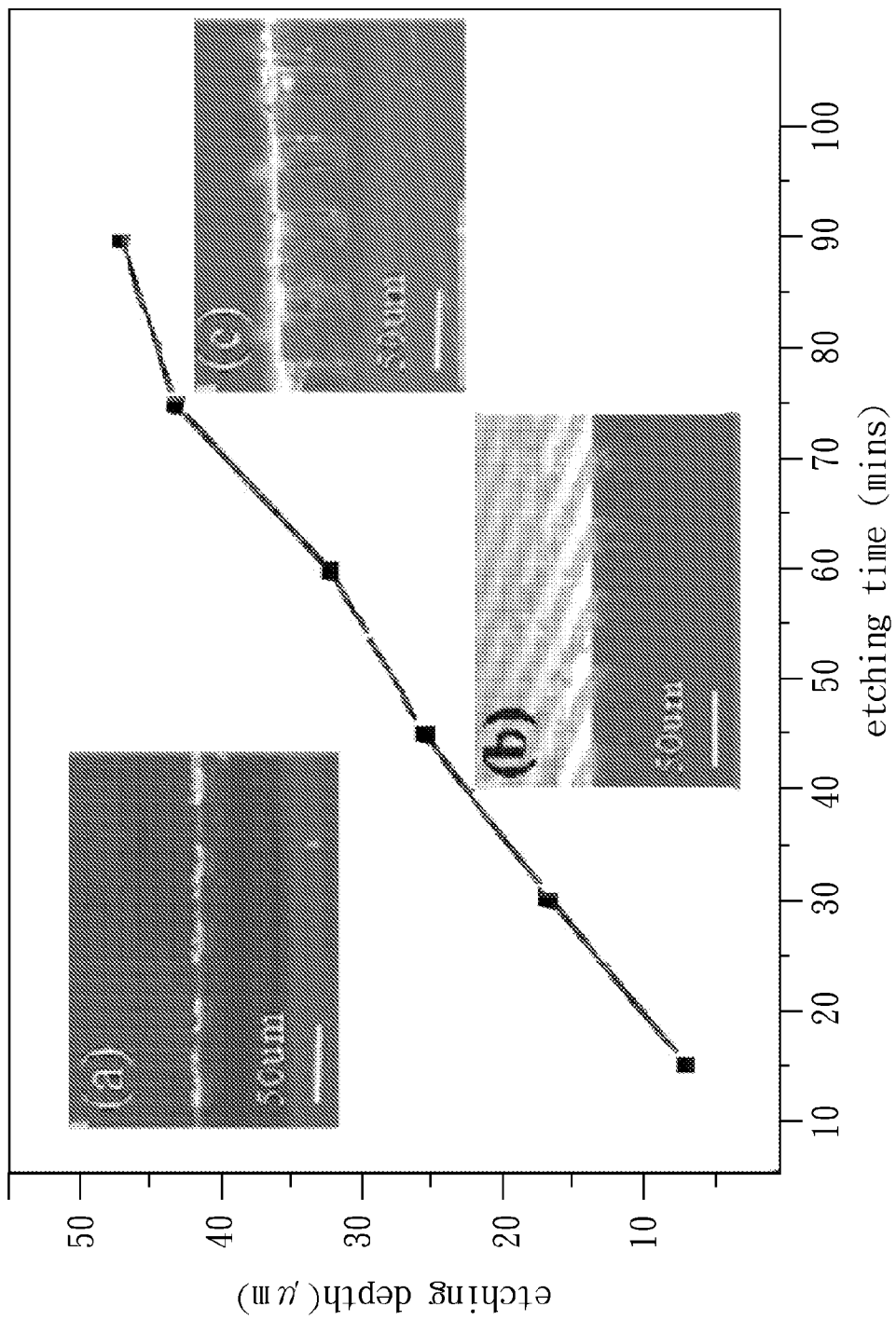
FIG. 5 shows the relationship between etching time and etching depth of the silicon trenches, according to an embodiment of this invention.

Fast etching rate is one advantage of this invention. The etching rate in the method of this invention may depend on the step of forming porous structure, and this step may take only tens of seconds. FIG. 5 shows the relationship between etching time and etching depth of the silicon trenches according to the example. The etching temperature is at room temperature, the period λ is 50 μm, and the width of the silicon trench is 20 μm. Inserts (a), (b), and (c) respectively show the SEM images of SiNWs after etching for 15, 45, and 75 min. As shown in FIG. 5, when the etching time is 75 min, the etching depth, i.e., the depth of the silicon trench, can reach about 50 μm, this indicating that the etching rate is about 30 μm/hr. If the etching temperature and/or the concentration of the etching solutions are increased, the etching rate can reach 60 μm/hr or more. If the etching time is increased, the depth of silicon trench can reach about 100 μm.

Accordingly, embodiments of this invention provide methods of forming silicon trenches with a depth can reach micrometer scale. In addition, methods of this invention effectively minimize instrument cost and reveal the potential of large-area fabrication. In addition, compared to conventional dry etching method, methods of this invention increase the etching rate from 1 μm/hr to 1 μm/min.

In addition, methods of this invention may be used to produce silicon trenches of semiconductor components such as optical biosensors, optical switches, and metal-oxide-semiconductor field effect transistor devices.

Figure 6:
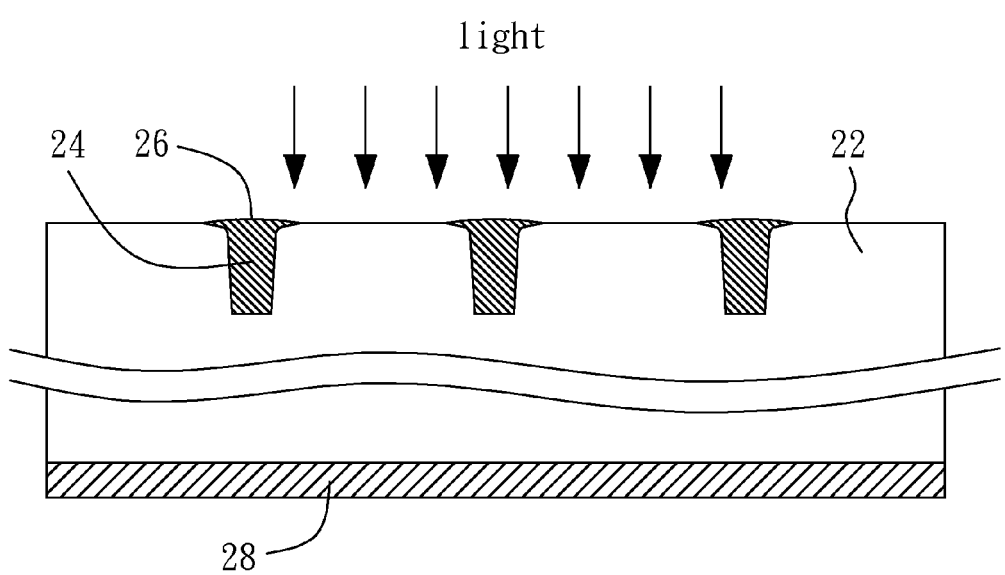
FIG. 6 shows that a front contact of a buried contact solar cell is produced by the method of this invention.

FIG. 6 shows that a front contact of a buried contact solar cell (BCSC) is produced by a method of this invention, according to an embodiment of this invention. Referring to FIG. 6, a buried contact solar cell 20 comprises a semiconductor layer 22 and a plurality of trenches 24 are formed by the method of this invention. The trenches 24 are filled with metal material and thus form a plurality of first electrodes 26, which are used as a front contact of the light-absorbing end of the solar cell 20. A second electrode 28 is arranged in the other end of the semiconductor layer 22. In addition, one or more p/n junctions (not shown) are arranged between the first electrode 26 and the second electrode 28. The p/n junctions are used for separating holes and electrons to be respectively collected by the first electrode 26 and the second electrode 28. In this embodiment, the ratio of the depth to the width of the trenches 24 is equal to about 4:1 or more. For example, the trenches 24 have a width about 4 μm, and a depth about 30 μm. By doing so, the contact area between the first electrode 24 and the semiconductor layer 22, the light absorption, and hence the power conversion efficiency of the solar cell 22 can be all increased.

Although specific embodiments have been illustrated and described, it will be appreciated by those skilled in the art that various modifications may be made without departing from the scope of the present invention, which is intended to be limited solely by the appended claims.

What is claimed is:

1. A method for forming a silicon trench, comprising the steps of:
providing a silicon substrate;
forming a patterned etching-barrier layer on the silicon substrate, thereby defining an etching area;
forming a plurality of metal catalysts on the etching area;
immersing the silicon substrate in a first etching solution to etch silicon under the metal catalysts in an anisotropic direction, the remained silicon forming a plurality of silicon nanostructures;
immersing the silicon substrate in a second etching solution, resulting a side etching between the silicon nanostructures and the silicon substrate, thereby substantially detaching the silicon nanostructures from the silicon substrate; and
removing the silicon nanostructures, the metal catalysts, and the etching-barrier layer, thereby forming the silicon trench.

2. The method as recited in claim 1, wherein the etching-barrier layer comprises photoresist, silicon nitrides ($Si_xN_y$), or other materials capable of blocking the metal catalysts.

3. The method as recited in claim 1, wherein the etching area defined by the etching-barrier layer has a regular or irregular shape.

4. The method as recited in claim 1, wherein the etching area is defined by photolithography, electron beam lithography, or imprint method.

5. The method as recited in claim 1, wherein the metal catalysts comprise gold (Au), silver (Ag), copper (Cu), platinum (Pt), iron (Fe), manganese (Mn), cobalt (Co), or other metal nanostructures capable of being a mediator of a redox between the first etching solution and the silicon substrate.

6. The method as recited in claim 1, wherein the metal catalysts are formed on the etching area by an electroless metal deposition (EMD).

7. The method as recited in claim 6, wherein the electroless metal deposition comprises to immerse the silicon substrate in a fluoride solution comprising metal ions, wherein the metal ions will be reduced and deposited in the etching area and thus formed as the metal catalysts.

8. The method as recited in claim 7, wherein an oxide layer is formed on the etching area before the silicon substrate is immersed in the fluoride solution comprising metal ions.

9. The method as recited in claim 1, wherein the metal catalysts are formed on the etching area by a thermal evaporation method.

10. The method as recited in claim 1, wherein the morphology of the metal catalysts comprises dendritic, granular, island-shaped, or meshes-shaped structures.

11. The method as recited in claim 1, wherein the first etching solution comprises aqueous solution of $HF/KAuCl_4$, $HF/AgNO_3$, $HF/K_2PtCl_6$, $HF/Cu(NO_3)_2$, $HF/(Fe(NO_3)_3$, $HF/(Mn(NO_3)_3$, $HF/Co(NO_3)_3$, $HF/H_2O_2$, or other aqueous solutions that can oxidize silicon and etch silicon oxide.

12. The method as recited in claim 1, wherein the temperature of the first etching solution and the second etching solution is controlled between about 0° C. and about 100° C.

13. The method as recited in claim 1, wherein the second etching solution comprises hydrogen fluoride (HF) and hydrogen peroxide ($H_2O_2$).

14. The method as recited in claim 1, further comprising filling the silicon trench with metal material and thus forming an electrode.

15. The method as recited in claim 14, wherein the electrode is used as a front contact of a solar cell.

16. The method as recited in claim 1, wherein the depth of the silicon trench is equal to or more than 50 µm.

17. The method as recited in claim 1, wherein the ratio of the depth to the width of the silicon trench is equal to or more than 4:1.

18. The method as recited in claim 1, wherein the etching rate of the silicon trench is equal to or more than 60 µm/hr.

19. The method as recited in claim 1, wherein the etching rate and the depth of the silicon trench are determined by the concentration, the temperature, and the etching time of the first etching solution and the second etching solution.

* * * * *